US012539065B2

(12) United States Patent
 Wang (10) Patent No.: US 12,539,065 B2
(45) Date of Patent: Feb. 3, 2026

(54) INPUT CIRCUITRY FOR RECEIVING ELECTRODE SIGNALS, A BIOPOTENTIAL SIGNAL SENSOR SYSTEM, A NEURAL PROBE, AND A METHOD FOR AMPLIFYING ELECTRODE SIGNALS

(71) Applicant: IMEC VZW, Leuven (BE)

(72) Inventor: Shiwei Wang, Leuven (BE)

(73) Assignee: IMEC VZW, Leuven (BE)

( * ) Notice: Subject to any disclaimer, the term of this patent is extended or adjusted under 35 U.S.C. 154(b) by 844 days.

(21) Appl. No.: 17/577,089

(22) Filed: Jan. 17, 2022

(65) Prior Publication Data

US 2022/0225922 A1 Jul. 21, 2022

(30) Foreign Application Priority Data

Jan. 18, 2021 (EP) ..................................... 21152118

(51) Int. Cl.
*A61B 5/30* (2021.01)
*A61B 5/00* (2006.01)
(Continued)

(52) U.S. Cl.
CPC .............. *A61B 5/304* (2021.01); *A61B 5/293* (2021.01); *A61B 5/31* (2021.01); *A61B 5/6868* (2013.01);
(Continued)

(58) Field of Classification Search
CPC .. A61B 5/304; A61B 5/31; A61B 5/30; A61B 5/319
See application file for complete search history.

(56) References Cited

U.S. PATENT DOCUMENTS 9,564,874 B1 2/2017 Alzaher et al.
2017/0281037 A1* 10/2017 Kidmose ............. H03F 3/45183
2020/0359921 A1* 11/2020 Manoli .................. A61B 5/293

FOREIGN PATENT DOCUMENTS

EP 2893873 A2 * 7/2015 ......... A61B 5/04004
EP 3111835 A1 1/2017
(Continued)

OTHER PUBLICATIONS

Ultra-low-power bulk-driven fully differential subthreshold OTAs with partial positive feedback for Gm-C filters (Year: 2017).*
(Continued)

*Primary Examiner* — Joanne M Rodden
*Assistant Examiner* — Alyssa M Pape
(74) *Attorney, Agent, or Firm* — MOSER TABOADA (57) ABSTRACT

An input circuitry for receiving electrode signals comprises: a plurality of channels for providing a multiplexed electrode signal input, each channel comprising a multiplexing switch for selecting one channel at a time, and an input transistor configured to be connected to an electrode, wherein the input transistor is configured to receive an electrode signal at a gate; and a reference input transistor, which is configured to be connected to a reference voltage at a gate; wherein an electrode signal received at a selected channel together with the reference voltage form input signals to an instrumentation amplifier; wherein the input circuitry is configured such that the input transistor of the selected channel forms part of a first flipped voltage follower and the reference input transistor forms part of a second flipped voltage follower.

13 Claims, 6 Drawing Sheets

(51) Int. Cl.
*A61B 5/293* (2021.01)
*A61B 5/304* (2021.01)
*A61B 5/31* (2021.01)
*H03F 3/04* (2006.01)

(52) U.S. Cl.
CPC ........ *H03F 3/04* (2013.01); *A61B 2562/0209* (2013.01); *A61B 2562/046* (2013.01); *H03F 2200/261* (2013.01)

(56) References Cited

FOREIGN PATENT DOCUMENTS

| EP | 3111835 B1 * | 6/2020 | ............... A61B 5/24 |
|---|---|---|---|
| EP | 3673846 A1 * | 7/2020 | ......... A61B 18/1492 |

OTHER PUBLICATIONS

Van Helleputte et al: "A 160 μA Biopotential Acquisition IC with Fully Integrated IA and Motion Artifact Suppression", IEEE Transactions on Biomedical Circuits and Systems, vol. 6, No. 6, pp. 552-561, 2012.

Hyejung et al: "A Configurable and Low-Power Mixed Signal SoC for Portable ECG Monitoring Applications", IEEE Transactions on Biomedical Circuits and Systems, vol. 8, No. 2, pp. 257-267, 2014.

Ng et al: "A Low-Power, High CMRR Neural Amplifier System Employing CMOS Inverter-Based OTAs With CMFB Through Supply Rails", IEEE Journal of Solid-State Circuits, vol. 51, No. 3, pp. 724-737, 2016.

Raducanu et al: "Time multiplexed active neural probe with 678 parallel recording sites", 2016 46th European Solid-State Device Research Conference, pp. 385-388, 2016.

Jun et al: "Fully integrated silicon probes for high-density recording of neural activity", Nature, vol. 551, pp. 232-236, 2017.

Sharan et al: "Ultra-low-power bulk-driven fully differential sub-threshold OTAs with partial positive feedback for Gm-C filters", Analog Integrated Circuits and Signal Porcessing, vol. 94, No. 3, pp. 427-447, 2017.

Smith et al: "A Scalable, Highly-Multiplexed Delta-Encoded Digital Feedback ECoG Recording Amplifier with Common and Differential-Mode Artifact Suppression", 2017 Symposium on VLSI Circuits, pp. C172-C173, 2017.

Sharma et al: "Acquisition of Neural Action Potentials Using Rapid Multiplexing Directly at the Electrodes", Micromachines, 9, 477, pp. 1-22, 2018.

Zheng et al: "A Fully Integrated Analog Front End for Biopotential Signal Sensing", IEEE Transactions on Circuits and Systems-I: Regular Papers, vol. 65, No. 11, pp. 3800-3809, 2018.

Wang et al: "A Compact Quad-Shank CMOS Neural Probe with 5,120 Addressable Recording Sites and 384 Fully Differential Parallel Channels", IEEE Transactions on Biomedical Circuits and Systems, vol. 13, No. 6, pp. 1625-1634, 2019.

Yuan et al: "An integrated microelectrode array system for neural signals recording", Microelectronics Journal, vol. 96, pp. 1-10, 2019.

Kim et al: "A 0.5-V Sub-10-μW 15.28-mΩ/ Bio-Impedance Sensor IC With Sub-1° Phase Error", IEEE Journal of Solid-State Circuits, vol. 55, No. 8, pp. 2161-2173, 2020.

Silicon Labs: "AN119: Calculating Settling Time for Switched Capacitor ADCs", https://link.edgepilot.com/s/32ec47b7/79Mw6OMyO02BTC44wyYrSg?u=https://www.silabs.com/documents/public/application-notes/an119.pdf, retrieved on Jan. 14, 2021.

European Search Report for Application No. EP21152118, dated Jun. 28, 2021.

* cited by examiner

INPUT CIRCUITRY FOR RECEIVING ELECTRODE SIGNALS, A BIOPOTENTIAL SIGNAL SENSOR SYSTEM, A NEURAL PROBE, AND A METHOD FOR AMPLIFYING ELECTRODE SIGNALS

CROSS-REFERENCE TO RELATED APPLICATION

This application claims priority to the European application 21152118.2, filed on Jan. 18, 2021, incorporated herein by reference.

TECHNICAL FIELD

The present inventive concept relates to an input circuitry for receiving electrode signals. The input circuitry may be used in a biopotential signal sensor system, and in particular, in a neural probe. The present inventive concept also relates to a method for amplifying electrode signals.

BACKGROUND

In many applications, an array of electrodes is used for sensing a distribution of electrical signals. For instance, neural probes use an array of electrodes for sensing neuronal activities. In order to increase spatial resolution of measurements, a smaller pitch between electrodes in the array is needed. Further, having a readout circuitry on a common substrate with the electrodes provides high signal integrity when interconnecting the electrodes with the readout circuitry. However, the readout circuitry for an array of a large number of electrodes will occupy a large area and it is therefore desired that electrode signals are multiplexed such that a readout circuitry may support plural electrodes.

However, when plural electrodes are interfaced with a common instrumentation amplifier for multiplexing electrode signals in the instrumentation amplifier, the electrode signals may be degraded. In particular, in order to provide multiplexing, switches may be used for selecting which electrode signal is input to the instrumentation amplifier. When the switches are clocked in an interleaved manner, the switches together with a parasitic capacitance form a switched capacitor circuit, which results in an equivalent resistance between electrodes connected to the instrumentation amplifier. When electrode impedance is high, which in particular is true for small electrodes, signal amplitude will be degraded due to reduced equivalent input impedance of the instrumentation amplifier due to multiplexing. Also, crosstalk between electrodes will increase.

SUMMARY

An objective of the present inventive concept is to provide an input circuitry that allows multiplexing of electrode signals while maintaining high signal integrity.

These and other objectives of the present inventive concept are at least partly met by the invention as defined in the independent claims. Preferred embodiments are set out in the dependent claims.

According to a first aspect, there is provided an input circuitry for receiving electrode signals, said input circuitry comprising: a plurality of channels for providing a multiplexed electrode signal input, wherein each channel comprises a multiplexing switch for selecting one channel at a time to provide electrode signal input, and wherein each channel comprises an input transistor configured to be connected to an electrode associated with the channel, wherein the input transistor is configured to receive an electrode signal at a gate of the input transistor; a reference input transistor, which is configured to be connected to a reference voltage at a gate of the reference input transistor; wherein an electrode signal received at a selected channel together with the reference voltage received at the reference input transistor form input signals to an instrumentation amplifier of the input circuitry; wherein the input circuitry is configured such that the input transistor of the selected channel forms part of a first flipped voltage follower of the instrumentation amplifier and the reference input transistor forms part of a second flipped voltage follower of the instrumentation amplifier.

The input circuitry is thus configured to receive electrode signals at different channels. Each channel comprises an input transistor, such that the electrode signals are provided at the gate of the input transistor of the respective channels. This implies that the gate of the input transistor is connected to the electrode while the channel is not selected to provide electrode signal input. Hence, the gate may follow potential variations of the electrode signal even when the channel is not selected. This implies that no input capacitance may need to be charged/discharged when an electrode signal is selected during multiplexing to avoid or at least reduce degrading of signal amplitude. Thus, the input circuitry provides high signal integrity with low crosstalk between electrodes while providing multiplexing of electrode signals.

According to an embodiment, each channel comprises a first multiplexing switch for selectively connecting or disconnecting a drain of the input transistor of the channel to a first shared node of the first flipped voltage follower.

This implies that the channels may selectively connected to a common node of the first flipped voltage follower. Hence, the first node is "shared" in that it is the node to which the drain of the input transistor of each channel is connected, when selected. However, only one channel will be selected at a time, such that multiple channels will not be simultaneously connected to the first shared node.

According to an embodiment, each channel further comprises a second multiplexing switch for selectively connecting or disconnecting the drain of the input transistor to a source of the input transistor.

The channel may be configured such that the drain of the input transistor is connected to the source of the input transistor when the channel is not selected to provide electrode signal input. Further, the channel may be configured such that the drain of the input transistor is disconnected from the source of the input transistor when the channel is selected to provide electrode signal input.

This implies that when the channel is not selected, the drain is shorted to the source in the input transistor. This implies any leakage current may be stopped.

According to an embodiment, the source of the input transistor of each channel is connected to a second shared node of the first flipped voltage follower.

The source of the input transistor of each channel may be configured to always be connected to the second shared node, regardless whether the channel is selected or not to provide electrode signal input. This implies that the source of the input transistor may follow the potential of the other electrodes instead of being floating when the channel is not selected. Thus, settling of the instrumentation amplifier to the electrode signal will be faster when the channel is selected, since less transients are induced when an electrode is selected for providing electrode signal input.

According to an embodiment, the first flipped voltage follower comprises the input transistor of the selected channel forming a first transistor of the first flipped voltage follower, a second transistor having a drain connected to a source of the first transistor, a current source connected to a drain of the first transistor and a gain element connected between the drain of the first transistor and a gate of the second transistor.

The first flipped voltage follower provides the second shared node between the drain of the second transistor and the source of the first transistor, wherein the second shared node has a voltage following the signal of the selected electrode.

Thanks to feedback of the second transistor, the second shared node will have low output impedance, providing an output to an output stage of the input circuitry with low output impedance.

The gain element may stabilize a voltage on the first shared node. This facilitates fast settling of the instrumentation amplifier to the electrode signal when a new channel is selected. Also, the gain element may ensure that the input transistor of the selected channel is in saturation mode.

According to an embodiment, an output node of the first flipped voltage follower is connected via a resistor to an output node of the second flipped voltage follower.

The output nodes of the first flipped voltage follower and the second flipped voltage follower follow the electrode signal input and the reference voltage, respectively. The resistor may thus convert an input signal voltage into current, which may be copied to the output stage.

According to an embodiment, the input circuitry further comprises an electrode offset calibration block, the electrode offset calibration block connected to opposite sides of the resistor and configured to inject a compensation current into the resistor for canceling a current jump induced by different DC offsets of electrodes when switching selection of channels.

This may ensure that a large electrode DC offset is not allowed to saturate the instrumentation amplifier.

When switching from between electrode input signals, a difference of DC electrode offsets will cause a voltage step jump at the output node of the first flipped voltage follower. Thanks to the use of the electrode offset calibration block, a compensation current may be injected into the resistor such that a current jump through the resistor due to the voltage jump at the output node of the first flipped voltage follower is canceled.

An offset calibration may be performed before electrode measurements are started, such that the DC electrode offsets may be determined. These DC electrode offsets may be stored to allow the electrode offset calibration block to provide a corresponding compensation current.

According to an embodiment, the input circuitry further comprises an output stage connected to receive signals from the first flipped voltage follower and the second flipped voltage follower.

Thus, the output stage may form a multiplexed signal such that the input circuitry may provide a multiplexed signal output from the output stage. The output stage may provide the multiplexed signals to circuitry for further processing of the electrode signals.

The output stage may comprise a capacitor for integrating the received current signal copied to the output stage. The charge sampling nature of this scheme allows the amplifier to be designed with a narrower bandwidth for the same settling accuracy compared to an instantaneous voltage sampling. Thus, aliasing of electrode noise may be reduced to avoid noise affecting quality of the output electrode signal.

According to an embodiment, the output stage comprises a reset switch for clearing signal information between readout of electrode signals of different selected channels.

The reset switch may be used to reset an integrating capacitor of the output stage between readout of signals from different channels. Thus, signal information may be easily cleared between readout of different channels.

According to an embodiment, the input circuitry comprises at least 4 channels.

This implies that the input circuitry and further processing circuitry which receives the multiplexed signal may be efficiently re-used. Thus, an area required by the input circuitry and further processing circuitry may be reduced by a factor 4 or more.

The number of electrode signals that may be multiplexed by an input circuitry may be dependent on a context in which the electrode signals are acquired. It should be realized that, if a large number of electrodes are used for sensing signals, a plurality of input circuitries may be used associated with different sets of electrodes.

According to a second aspect, there is provided a biopotential signal sensor system, comprising: the input circuitry according to the first aspect; and a plurality of electrodes configured for sensing a biopotential signal, wherein each electrode is connected to the gate of an input transistor of a channel among the plurality of channels, wherein one electrode is associated with each channel.

Effects and features of this second aspect are largely analogous to those described above in connection with the first aspect. Embodiments mentioned in relation to the first aspect are largely compatible with the second aspect.

In many applications sensing biopotential signals, it may be interesting to detect signals from a plurality of electrodes. This may be useful for sensing distribution of biopotential within a body or for sensing biopotentials in several points of interest.

Further, when detecting biopotential signals, the electrodes are worn by a subject, and at least the input circuitry receiving the electrode signals may also need to be worn by the subject. This implies that an area required by the input circuitry affects a size of a device that is worn by the subject. Hence, in order to provide a biopotential signal sensor system that facilitates convenience to the subject from which signals are acquired, a small size of the input circuitry is desired. In this respect, the multiplexing of signals by the input circuitry, enabling the input circuitry to be shared by several electrodes facilitates a small size of a device that is to be worn by the subject.

The biopotential signal sensor system may for instance be configured to sense a biopotential signal relating to electrocardiography, electroencephalography, electrocorticography, or electromyography. However, as further discussed below, the biopotential signal sensor system may be of particular interest in a neural probe for sensing potentials in a brain, such as local field potential and action potential.

According to an embodiment, the input circuitry is arranged on a common substrate with the plurality of electrodes.

This implies that the biopotential signal sensor system may be compact. Further, it may ensure high signal integrity of the electrode signals received by the input circuitry.

According to a third aspect, the biopotential signal sensor system is a neural probe, wherein the plurality of electrodes is arranged on a carrier configured for being inserted into a brain.

Effects and features of this third aspect are largely analogous to those described above in connection with the first and second aspects. Embodiments mentioned in relation to the first and second aspects are largely compatible with the third aspect.

In neural probes, there is a desire to provide as small electrodes as possible in order to have a high spatial resolution of signals acquired from a brain. This implies that a large number of electrodes may be used, such that there may be a large need to multiplex signals in order to reduce size of an area of circuitry for processing the electrode signals.

Further, since electrodes are small, the electrodes have high impedance. Therefore, a high input impedance of the input circuitry is desired so as not to degrade signal quality of the electrode signals. Hence, the input circuitry is well-suited for use in a neural probe, since the input circuitry may maintain a high input impedance even though multiplexing is used.

According to a fourth aspect, there is provided a method for amplifying electrode signals, said method comprising: receiving electrode signals on a plurality of channels of an amplifying input circuitry for providing multiplexed amplifying of the electrode signals, wherein each channel comprises an input transistor configured to be connected to an electrode associated with the channel, wherein the input transistor is configured to receive an electrode signal at a gate of the input transistor; selecting a first electrode signal as input to multiplexed amplifying by connecting the input transistor of a first channel to form part of a first flipped voltage follower of an instrumentation amplifier and by all other channels being deselected, the first electrode signal forming an input signal pair together with a reference voltage signal to the instrumentation amplifier; and selecting a second electrode signal as input to multiplexed amplifying by connecting the input transistor of a second channel to form part of the first flipped voltage follower of the instrumentation amplifier and by all other channels being deselected, the second electrode signal forming an input signal pair together with the reference voltage signal to the instrumentation amplifier.

Effects and features of this fourth aspect are largely analogous to those described above in connection with the first, second, and third aspects. Embodiments mentioned in relation to the first, second, and third aspects are largely compatible with the fourth aspect.

Each channel comprises an input transistor, such that the electrode signals are provided at the input transistor of the respective channels, even when the channel is not selected to provide electrode signal input to the amplifying circuitry. The electrode signal may be provided at a gate of the input transistor. This implies that no input capacitance may need to be charged/discharged when an electrode signal is selected during multiplexing to avoid or at least reduce degrading of signal amplitude. Thus, the method may ensure high signal integrity while providing multiplexing of electrode signals.

The method may be controlled by a control unit, which may provide clocking signals for synchronizing selecting of an electrode signal of one channel and deselecting all other channels.

The selecting and deselecting of an electrode signal of a channel may be performed by turning on and off a first multiplexing switch.

The method may further comprise connecting a drain of the input transistor to a source of the input transistor when a channel is deselected. This implies that when the channel is not selected, the drain is shorted to the source in the input transistor. This implies any leakage current may be stopped.

The connecting of the drain of the input transistor to the source of the input transistor may be performed by turning on a second multiplexing switch. Further, when the channel is selected, the second multiplexing switch may be turned off to disconnect the drain of the input transistor from the source of the input transistor.

According to an embodiment, the method further comprises, when selecting the second electrode signal, providing a reset signal to an output stage of the instrumentation amplifier for clearing signal information between readout of electrode signals of different selected channels.

The reset switch may be used to reset an integrating capacitor of the output stage between readout of signals from different channels. Thus, signal information may be easily cleared between readout of different channels.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
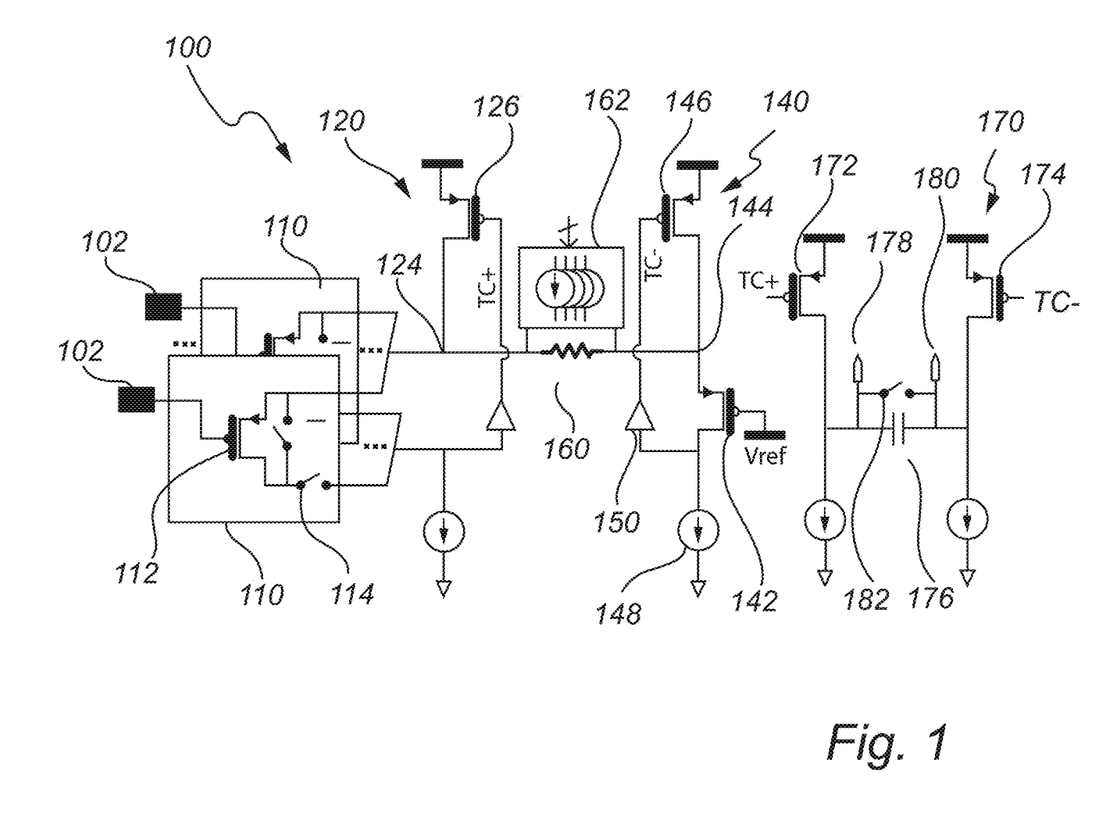
FIG. 1 is a schematic view of an input circuitry according to an embodiment.

Referring now to FIG. 1, an input circuitry 100 for receiving electrode signals according to an embodiment will be described. The input circuitry 100 is configured to receive signals from a plurality of electrodes 102 and the input circuitry 100 is configured to form multiplexed signal from the signals of the plurality of electrodes 102.

The electrodes 102 may be any type of electrode 102 which is configured to sense an electrical potential at a location of the electrode 102. The electrode 102 may therefore comprise a conducting part which is configured to sense the electrical potential. The electrode 102 could for instance be used for sensing biopotential, i.e. an electrical potential in a body of a human being or an animal. However, the electrode 102 could be used in numerous other applications.

The input circuitry 100 comprises a plurality of channels 110, wherein each channel is associated with one electrode 102. Each channel 110 comprises an input transistor 112. The electrode 102 associated with the channel 110 is connected to a gate of the input transistor 112, such that an electrode signal from the electrode 102 is received at the gate.

The input circuitry 100 is configured to select one channel 110 at a time to provide electrode signal input to the input circuitry 100. Thus, at each time instant, one channel may be selected while all other channels may be deselected.

Each channel 110 may comprise a first multiplexing switch 114, which is configured to select the electrode signal of the channel 110 to provide the electrode signal input of the input circuitry 100.

The gate of the input transistor 112 is connected to the electrode 102, even when the channel 110 is not selected. This implies that the gate of the input transistor 112 may follow the potential variations of the electrode signal from the electrode 102 associated with the channel 110 even when the channel 110 is not selected. Hence, no charge/discharge from the electrode 102 is required when the channel 110 is selected, such that signal amplitude is not degraded.

The electrode signal provided at the gate of the input transistor 112 of the selected channel 110 together with a reference voltage forms a pair of input signals to an instrumentation amplifier of the input circuitry 100. The input circuitry 100 may further comprise a reference input transistor 142 which is configured to receive the reference voltage at a gate of the reference input transistor 142. The reference voltage may be received by the reference input transistor 142 being connected to a reference electrode or to a known potential, such as ground.

The input circuitry 100 forms a first flipped voltage follower 120 with the input transistor 112 of the selected channel forming a first transistor of the first flipped voltage follower 120. The input circuitry 100 further comprises a second flipped voltage follower 140 with the reference input transistor 142 forming a first transistor of the second flipped voltage follower.

The first flipped voltage follower 120 is configured to receive the electrode signal input (at the selected channel 110) and is configured to provide a potential following the potential of the electrode signal input at a first output node 124. The second flipped voltage follower 140 is configured to provide a potential following the potential of the reference voltage at a second output node 144.

The first and second output nodes 124 and 144 are arranged on opposite sides of a resistor 160, such that the voltage across the resistor 160 is converted to a current. The current is copied to an output stage 170 of the input circuitry 100.

The input circuitry 100 further comprises an electrode offset calibration block 162, which is connected to opposite sides of the resistor 160. The electrode offset calibration block 162 is configured to inject a compensation current into the resistor 160 for canceling a current jump induced by different DC offsets of the electrodes 102 when switching selection of channels 110.

An offset calibration may be performed before receipt of electrode signals from the electrodes 102 are started, such that the DC electrode offsets may be determined for each of the electrodes 102. These DC electrode offsets may be stored to allow the electrode offset calibration block 162 to provide a corresponding compensation current.

The electrode offset calibration block 162 may be configured to receive a digital signal corresponding to the stored DC electrode offset for a selected electrode 102 and may convert the received digital signal to an analog compensation current to be injected into the resistor 160.

The current through the resistor 160 flows through a second transistor 126 of the first flipped voltage follower 120 and through a second transistor 146 of the second flipped voltage follower 140. The signal on a gate of the second transistor 126 of the first flipped voltage follower 120 is also provided to a gate of a first transistor 172 of the output stage 170. The signal on a gate of the second transistor 146 of the second flipped voltage follower 140 is also provided to a gate of a second transistor 174 of the output stage 170. Thus, the current flowing through the resistor 160, the second transistor 126 of the first flipped voltage follower and the second transistor 146 of the second flipped voltage follower is copied to the output stage 170.

The output stage 170 comprises a capacitor 176, which is configured to receive the current copied from the resistor 160. The capacitor 176 is configured to integrate the received current signal. The charge sampling nature of this scheme allows the input circuitry 100 to be designed with a narrower bandwidth for the same settling accuracy compared to an instantaneous voltage sampling. Thus, aliasing of electrode noise may be reduced to avoid noise affecting quality of the output electrode signal.

Output nodes 178, 180 are connected on opposite sides of the capacitor 176 for providing a differential output signal from the output stage 170 of the input circuitry 100. The output stage 170 further comprises a reset switch 182. The reset switch 182 is configured to be enabled when a new electrode 102 is selected to provide the electrode signal input. The reset switch 182 clears the signal information between readout of different channels 110. Also, the reset switch 182 may isolate the output nodes 178, 180 from any glitched due to the switching between channels 110.

Figure 2A:
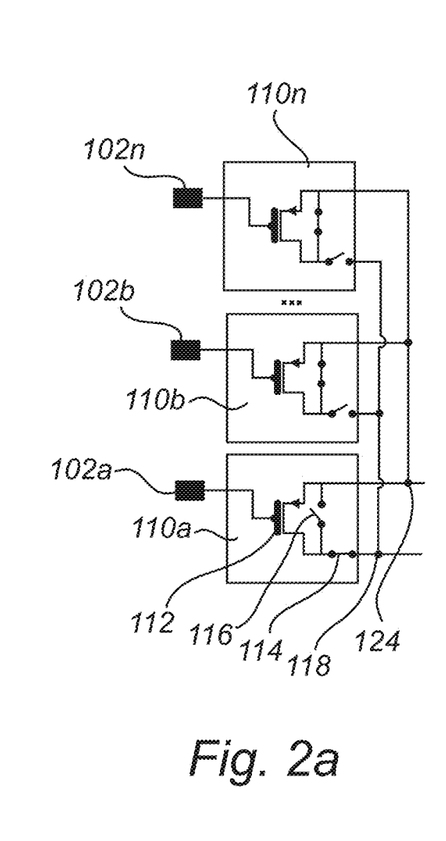
FIGS. 2a-c are schematic views of electrodes being connected to the input circuitry at different points in time.
Figure 2B:
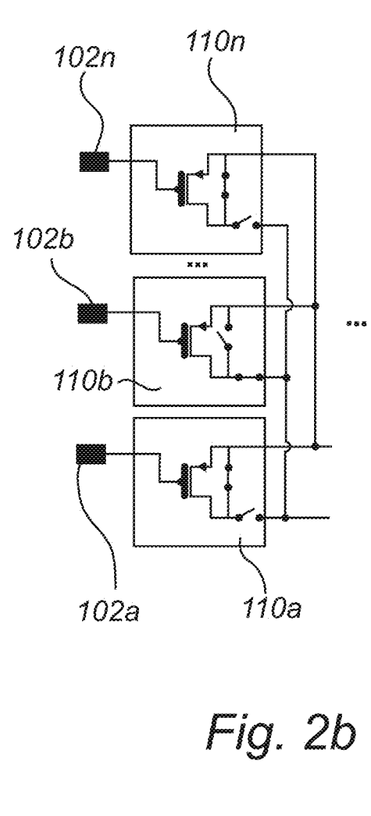
Figure 2C:
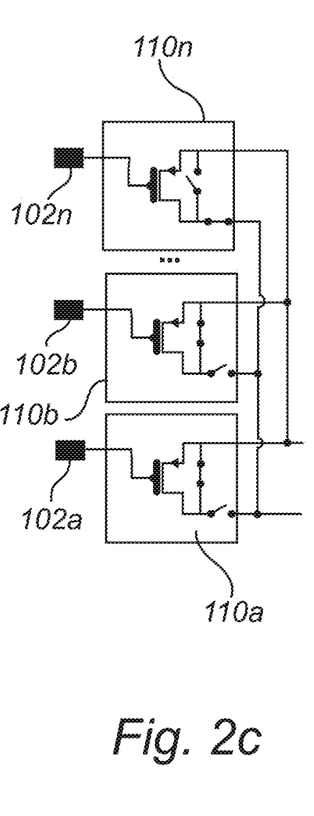

Referring now to FIGS. 2*a-c*, an embodiment for selection of channels 110 among N channels, where N is an integer number, will be further described. In each of FIGS. 2*a-c*, a first channel 11 associated with a first electrode 102*a*, a second channel 110*b* associated with a second electrode 102*b*, and an N'th channel 110*n* associated with an N'th electrode 102*n* are shown.

Each channel 110 comprises the first multiplexing switch 114. The first multiplexing switch is configured to selectively connect or disconnect a drain of the input transistor 112 to a first shared node 118 of the first flipped voltage follower 120. The first node 118 is "shared" in that it is the node to which the drain of the input transistor 112 of each channel 110 is connected, when selected. However, only one channel 110 will be selected at a time, such that multiple channels will not be simultaneously connected to the first shared node 118.

When the first multiplexing switch 114 of a channel 110 is turned on to select the channel 110, the input transistor 112 of the channel 110 forms part of the first flipped voltage follower 120, by the drain of the input transistor 112 being connected to the first shared node 118, which is part of the first flipped voltage follower 120.

Each channel 110 may further be connected to a second shared node 124, which corresponds to the first output node 124 of the first flipped voltage follower 120. The source of the input transistor 112 may be connected to the second shared node 124, even when the channel 110 is not selected. This implies that the source of the input transistor 112 follows potentials of the other electrodes 102 instead of being floating when the channel 110 is not selected. This implies that settling to the electrode signal will be fast when the channel 110 is selected, since less transients are induced when an electrode 102 is selected for providing electrode signal input.

Each channel 110 may further comprise a second multiplexing switch 116. The second multiplexing switch 116 may selectively connect or disconnect the drain of the input transistor 112 to the source of the input transistor 112. When a channel 110 is not selected, the drain is shorted to the source of the input transistor 112 by the second multiplexing switch 116 being turned on. This implies that any leakage current from the input transistor 112 affecting readout of an electrode signal of another channel 110 may be stopped.

FIG. 2a illustrates a point in time when the first channel 110a is selected for providing electrode signal input from the electrode 102a. At the point in time illustrated in FIG. 2a, a clocking signal controlling the first multiplexing switch 114 of the first channel 110a is high and a clocking signal controlling the second multiplexing switch 116 of the first channel 110a is low. This implies that the drain is disconnected from the source of the input transistor 112 in the first channel 110a and the drain of the input transistor 112 of the first channel 110a is connected to the first shared node 118.

Further, at the point in time illustrated in FIG. 2a, clocking signals controlling the first multiplexing switches 114 of all the remaining channels, illustrated by channels 110b, 110n, are low to disconnect the drain of the input transistors 112 of these channels 110b, 110n from the first shared node 110. Also, clocking signals controlling the second multiplexing switches 116 of all the remaining channels, illustrated by channels 110b, 110n, are high to short the drain to the source of the input transistors 112 of these channels 110.

FIG. 2b illustrates a point in time when the second channel 110b is selected for providing electrode signal input from the electrode 102a. At the point in time illustrated in FIG. 2b, the clocking signal controlling the first multiplexing switch 114 of the second channel 110b is high and the clocking signal controlling the second multiplexing switch 116 of the second channel 110b is low. This implies that the drain is disconnected from the source of the input transistor 112 in the second channel 110b and the drain of the input transistor 112 of the second channel 110b is connected to the first shared node 118.

Further, at the point in time illustrated in FIG. 2b, clocking signals controlling the first multiplexing switches 114 of all the remaining channels, illustrated by channels 110a, 110n, are low to disconnect the drain of the input transistors 112 of these channels 110a, 110n from the first shared node 110. Also, clocking signals controlling the second multiplexing switches 116 of all the remaining channels, illustrated by channels 110a, 110n, are high to short the drain to the source of the input transistors 112 of these channels 110.

The channels 110 may be sequentially selected one by one to provide the electrode signal input in a multiplexed manner. FIG. 2c illustrates a point in time when the N'th channel 110n is selected for providing electrode signal input from the electrode 102n. At the point in time illustrated in FIG. 2c, the clocking signal controlling the first multiplexing switch 114 of the N'th channel 110n is high and the clocking signal controlling the second multiplexing switch 116 of the N'th channel 110n is low. This implies that the drain is disconnected from the source of the input transistor 112 in the N'th channel 110n and the drain of the input transistor 112 of the N'th channel 110n is connected to the first shared node 118.

Further, at the point in time illustrated in FIG. 2c, clocking signals controlling the first multiplexing switches 114 of all the remaining channels, illustrated by channels 110a, 110b, are low to disconnect the drain of the input transistors 112 of these channels 110a, 110b from the first shared node 110. Also, clocking signals controlling the second multiplexing switches 116 of all the remaining channels, illustrated by channels 110a, 110b, are high to short the drain to the source of the input transistors 112 of these channels 110.

Once all channels 110a, 110b, 110n have been selected to provide electrode signal input, the first channel 110a may again be selected, such that a new sequence of sequentially selecting each channel 110a, 110b, 110n one at a time may be initiated.

Figure 3:
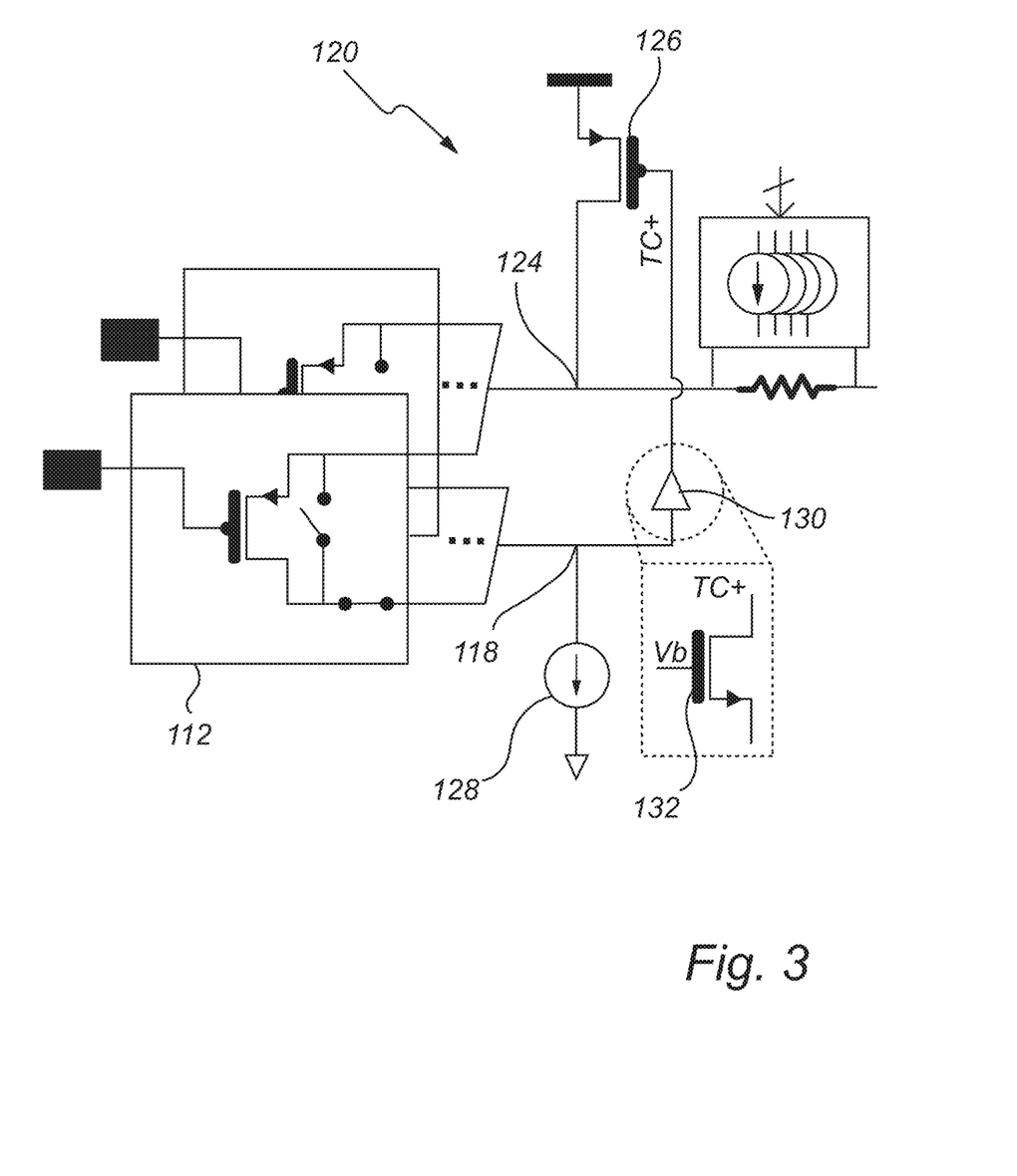
FIG. 3 is a detailed schematic view of a first flipped voltage follower of the input circuitry according to an embodiment.

Referring now to FIG. 3, the first flipped voltage follower 120 according to an embodiment will be described in further detail.

The flipped voltage follower 120 is formed by the input transistor 112 of the selected channel 110 (forming a first transistor 112), the second transistor 126, a current source 128, and a gain element 130. The first transistor 112 and the second transistor 126 may be p-type metal-oxide-semiconductor (PMOS) transistors.

The current source 128 enables a current through the first transistor 112 to be held stable, independent of an output current from the flipped voltage follower.

The output node 124 is arranged between a drain of the second transistor 126 and a source of the first transistor 112. The output node 124 will have a potential following the electrode signal received at the gate of the first transistor 112.

The second transistor 126 provides feedback of the flipped voltage follower 120. The output node 124 will have a low output impedance because of the feedback of the second transistor 126.

The signal on the first shared node 118 is passed through a gain element 130 to be provided to a gate of the second input transistor 126. The signal on the first shared node 118 will have a small ac component due to attenuation of the gain element 130. Thanks to use of the gain element 130, it is easy to maintain the first transistor 112 in saturation mode and also to provide a fast settling time during multiplexing.

As shown in enlargement in FIG. 3, the gain element 130 may comprise an n-type metal-oxide-semiconductor (NMOS) transistor 132, with the source connected to the first shared node 118 and the drain connected to the gate of the second transistor 126. The NMOS transistor 132 may further receive a bias voltage on a gate of the NMOS transistor 132.

The second flipped voltage follower 140 may be configured in a corresponding manner, receiving the reference voltage at the reference input transistor 142. As shown in FIG. 1, the second flipped voltage follower 140 may thus comprise the reference input transistor 142, the second transistor 146, a current source 148, and a gain element 150.

Figure 4:
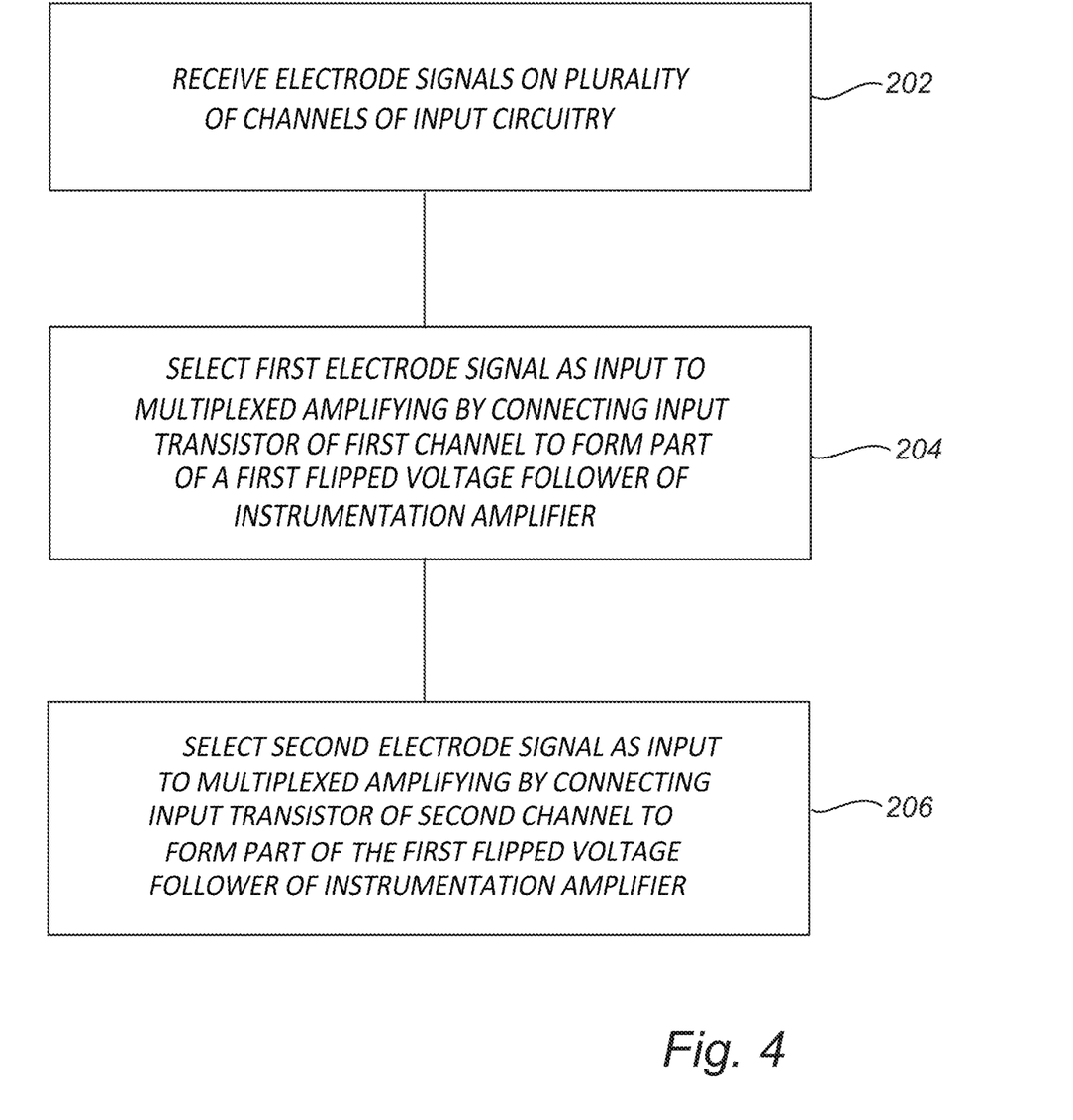
FIG. 4 is a flow chart of a method according to an embodiment.
Figure 5:
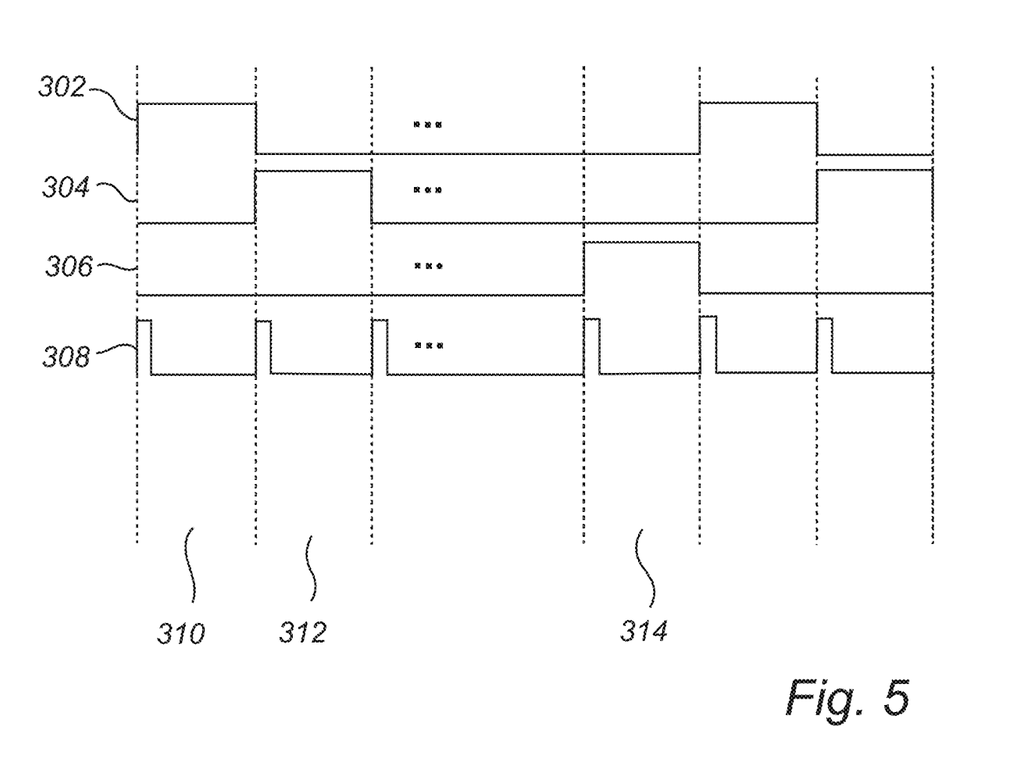
FIG. 5 is a clocking diagram of control signals for controlling multiplexing switches of the input circuitry according to an embodiment.

Referring now to FIGS. 4 and 5, a method according to an embodiment will be described in relation to a flow chart in FIG. 4 and a clocking diagram illustrating signals of switches in FIG. 5.

The method comprises receiving 202 electrode signals on a plurality of channels 110 of the amplifying input circuitry 100 for providing multiplexed amplifying of the electrode signals.

The method further comprises selecting 204 a first electrode signal as input to multiplexed amplifying by connecting the input transistor 112 of the first channel 110a to form part of the first flipped voltage follower 120 of the instrumentation amplifier and by all other channels 110b, 110n being deselected. Thus, the first electrode signal forms an input signal pair together with the reference voltage signal to the instrumentation amplifier.

As shown in FIG. 5, a first clocking signal 302 for controlling the first multiplexing switch 114 of the first channel 110a is thus set to be high, while the clocking signals 304, 306 for controlling the first multiplexing switch 114 of remaining channels 110b, 110n are low, during a first period of time 310. Thus, the first electrode 102a is selected to provide the electrode signal input during the first period of time 310.

The method further comprises selecting 206 a second electrode signal as input to multiplexed amplifying by connecting the input transistor 112 of the second channel 110b to form part of the first flipped voltage follower 120 of the instrumentation amplifier and by all other channels 110a, 110n being deselected. Thus, the second electrode signal forms an input signal pair together with the reference voltage signal to the instrumentation amplifier.

As shown in FIG. 5, the second clocking signal 304 for controlling the first multiplexing switch 114 of the second channel 110b is thus set to be high, while the clocking signals 302, 306 for controlling the first multiplexing switch 114 of remaining channels 110a, 110n are low, during a second period of time 312. Thus, the second electrode 102b is selected to provide the electrode signal input during the second period of time 312.

Further, the selection of electrodes to provide the electrode signal input proceeds until all electrodes have been selected. Thus, in a N'th period of time 314, the N'th clocking signal 306 for controlling the first multiplexing switch 114 of the N'th channel 110n is thus set to be high, while the clocking signals 302, 304 for controlling the first multiplexing switch 114 of remaining channels 110a, 110b are low.

As can be seen in FIG. 5, the electrodes 102 and their associated input transistors 112 are connected into the instrumentation amplifier in a time interleaved manner controlled by the clocking signals 302, 304, 306. The clocking signal 302, 304, 306 controlling a first multiplexing switch 114 will be high during a single period of time, when the electrode associated with the channel controlled by the clocking signal is selected, and will then be low during multiple periods of time when electrodes associated with other channels are selected.

Although not shown in FIG. 5, clocking signals controlling the second multiplexing switch 116 of each channel may also be synchronized with the clocking signals 302, 304, 306. The clocking signal controlling the second multiplexing switch 116 will be low during a single period of time, when the electrode associated with the channel controlled by the clocking signal is selected, and will then be high during multiple periods of time when electrodes associated with other channels are selected.

During each transition from a current electrode being selected to a next electrode being selected, a reset signal 308 is enabled to turn on the reset switch 182 and reset the capacitor 176, which clears the signal information of the current electrode. Also, at each transition, digital signal input to the electrode offset calibration block 162 is updated to a signal associated with the next electrode.

Figure 6:
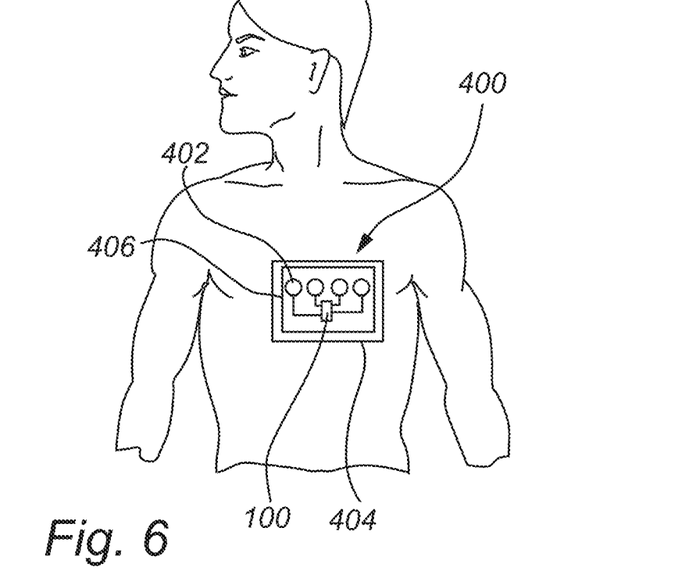
FIG. 6 is a schematic view of a biopotential signal sensor system according to an embodiment.

Referring now to FIG. 6, a biopotential signal sensor system 400 according to an embodiment will be described.

The biopotential signal sensor system 400 comprises a plurality of electrodes 402 configured for sensing a biopotential signal, which may correspond to the plurality of electrodes 102 described above. The biopotential signal sensor system 400 further comprises input circuitry for receiving the biopotential signals from the electrodes 402 and for providing multiplexed amplifying of the biopotential signals. The biopotential signal sensor system 400 may thus comprise the input circuitry 100 according to the embodiment described above.

The biopotential signals from the electrodes 402 may each be connected to the gate of the input transistor 112 of a respective channel 110 of the input circuitry 100. Thus, the input circuitry 100 may allow multiplexing of the biopotential signals.

The biopotential signal sensor system 400 may be configured to be worn by a subject. The biopotential signal sensor system 400 may thus comprise a carrier configured for attachment to the subject or for arrangement around a body part of the subject. For instance, the biopotential signal sensor system 400 may comprise a patch 404 for attaching the biopotential signal sensor system 400 to the subject.

The biopotential signal sensor system 400 may comprise further processing circuitry for further processing of the multiplexed electrode signals output by the input circuitry 100. Thus, the biopotential signal sensor system 400 may provide analysis of the electrode signals.

The biopotential signal sensor system 400 may also or alternatively comprise a communication unit for wired or wireless communication to a remote unit for further processing of the electrode signals. The biopotential signal sensor system 400 may communicate the multiplexed electrode signals output by the input circuitry 100 to the remote unit or may further process the multiplexed electrode signals before communicating the further processed signals to the remote unit.

The input circuitry 100 may be arranged on a common substrate 406 with the plurality of electrodes 402. This implies that the biopotential signal sensor system 400 may be compact. Further, it may ensure high signal integrity of the electrode signals received by the input circuitry 100.

The biopotential signal sensor system 400 may for instance be configured to sense a biopotential signal relating to electrocardiography, electroencephalography, electrocorticography, or electromyography.

Figure 7:
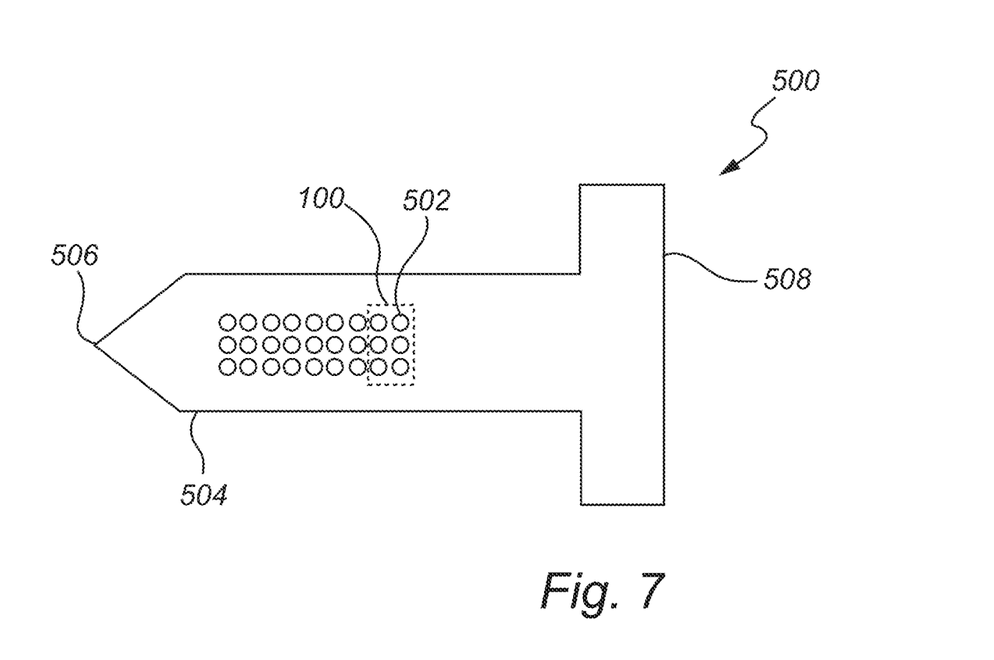
FIG. 7 is a schematic view of a neural probe according to an embodiment.

Referring now to FIG. 7, a neural probe 500 according to an embodiment will be described. The neural probe 500 may incorporate electrodes and input circuitry of the biopotential signal sensor system 400 as described above.

In the neural probe 500, small electrodes 502 are used in order to have a high spatial resolution of signals acquired from a brain. This implies that a large number of electrodes 502 may be used, such that there may be a large need to multiplex signals in order to reduce size of an area of circuitry for processing the electrode signals.

Further, since electrodes 502 are small, the electrodes 502 have high impedance. Therefore, a high input impedance of the input circuitry 100 is desired so as not to degrade signal quality of the electrode signals. Hence, the input circuitry 100 as described above is well-suited for use in the neural probe 500, since the input circuitry 100 may maintain a high input impedance even though multiplexing is used.

The electrodes 502 may be arranged on a carrier 504 configured for being inserted into the brain to allow the electrodes 502 to acquire signals from the brain. The carrier 504 may have a pointed tip 506 for facilitating insertion into the brain and may have a base portion 508 which is intended not to be inserted into the brain.

The electrodes 502 are arranged in the portion of the carrier 504 intended to be inserted into the brain. The input circuitry 100 may be arranged in the portion of the carrier 504 intended to be inserted into the brain, such that the input circuitry 100 may be arranged in a layer below the electrodes 502, illustrated as dashed lines for an input circuitry 100 supporting the electrodes 502 above the input circuitry 100. According to an alternative, the input circuitry 100 may be arranged in the base portion 508 so as to enable minimizing a size of a part the neural probe 500 to be inserted into the brain.

The electrodes 502 and the input circuitry 100 may still be arranged on a common substrate to ensure high signal integrity of the electrode signals received by the input circuitry 100.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. An input circuitry for receiving electrode signals, said input circuitry comprising:
   a plurality of channels for providing a multiplexed electrode signal input, wherein each channel comprises a multiplexing switch for selecting one channel at a time to provide electrode signal input, and wherein each channel comprises an input transistor configured to be connected to one electrode corresponding to the channel, wherein the input transistor is configured to receive an electrode signal at a gate of the input transistor; and
   a reference input transistor, which is configured to be connected to a reference voltage at a gate of the reference input transistor,
   wherein an electrode signal received at a selected channel together with the reference voltage received at the reference input transistor form input signals to an instrumentation amplifier of the input circuitry,
   wherein the input circuitry is configured such that the input transistor of the selected channel forms part of a first flipped voltage follower of the instrumentation amplifier and the reference input transistor forms part of a second flipped voltage follower of the instrumentation amplifier,
   wherein each channel comprises a first multiplexing switch, and
   wherein the first multiplexing switch is configured to select the channel so that the input transistor of the channel forms part of the first flipped voltage follower by the drain of the input transistor being connected to a first shared node, which is part of the first flipped voltage follower.

2. The input circuitry according to claim 1, wherein each channel further comprises a second multiplexing switch for selectively connecting or disconnecting the drain of the input transistor to a source of the input transistor.

3. The input circuitry according to claim 2, wherein the source of the input transistor of each channel is connected to a second shared node of the first flipped voltage follower.

4. The input circuitry according to claim 1, wherein the first flipped voltage follower comprises the input transistor of the selected channel forming a first transistor of the first flipped voltage follower, a second transistor having a drain connected to a source of the first transistor, a current source connected to a drain of the first transistor and a gain element connected between the drain of the first transistor and a gate of the second transistor.

5. The input circuitry according to claim 1, wherein an output node of the first flipped voltage follower is connected via a resistor to an output node of the second flipped voltage follower.

6. The input circuitry according to claim 5, further comprising an electrode offset calibration block, the electrode offset calibration block connected to opposite sides of the resistor and configured to inject a compensation current into the resistor for canceling a current jump induced by different DC offsets of electrodes when switching selection of channels.

7. The input circuitry according to claim 1, wherein the input circuitry further comprises an output stage connected to receive signals from the first flipped voltage follower and the second flipped voltage follower.

8. The input circuitry according to claim 7, wherein the output stage comprises a reset switch for clearing signal information between readout of electrode signals of different selected channels.

9. The input circuitry according to claim 1, wherein the input circuitry comprises at least 4 channels.

10. A biopotential signal sensor system, comprising:
    the input circuitry according to claim 1; and
    a plurality of electrodes configured for sensing a biopotential signal, wherein each electrode is connected to the gate of an input transistor of a channel among the plurality of channels, wherein one electrode corresponds to each channel.

11. The biopotential signal sensor system according to claim 10, wherein the input circuitry is arranged on a common substrate with the plurality of electrodes.

12. The biopotential signal sensor system according to claim 10, wherein the biopotential signal sensor system is a neural probe, wherein the plurality of electrodes is arranged on a carrier configured for being inserted into a brain.

13. A method for amplifying electrode signals, said method comprising:
    receiving electrode signals on a plurality of channels of the input circuitry according to claim 1 for providing multiplexed amplifying of the electrode signals;
    selecting a first electrode signal as input to multiplexed amplifying by connecting the input transistor of a first channel to form part of the first flipped voltage follower of the instrumentation amplifier and by all other channels being deselected, the first electrode signal forming an input signal pair together with a reference voltage signal to the instrumentation amplifier; and
    selecting a second electrode signal as input to multiplexed amplifying by connecting the input transistor of a second channel to form part of the first flipped voltage follower of the instrumentation amplifier and by all other channels being deselected, the second electrode signal forming an input signal pair together with the reference voltage signal to the instrumentation amplifier.

* * * * *